United States Patent [19]

Hanawa

[11] Patent Number: 4,799,012
[45] Date of Patent: Jan. 17, 1989

[54] MAGNETIC RESONANCE IMAGING SYSTEM
[75] Inventor: Masatoshi Hanawa, Ootawara, Japan
[73] Assignee: Kabushiki Kaishi Toshiba, Kawasaki, Japan
[21] Appl. No.: 151,210
[22] Filed: Feb. 1, 1988
[30] Foreign Application Priority Data
  Feb. 2, 1987 [JP] Japan .................................. 62-23160
[51] Int. Cl.$^4$ ............................................. G01R 33/20
[52] U.S. Cl. ..................................... 324/309; 324/300
[58] Field of Search ............... 324/300, 307, 309, 311, 324/312, 313, 314, 318, 322; 128/653
[56] References Cited
  U.S. PATENT DOCUMENTS 3,932,805  1/1976  Abe et al. .............................. 324/309
  4,613,949  9/1986  Glover et al. ......................... 324/309
  4,614,907  9/1986  Nagayama ............................. 324/312
  4,651,097  3/1987  Iwaoka et al. ........................ 324/309
  4,737,714  4/1988  Hanawa .................................. 324/309

FOREIGN PATENT DOCUMENTS
  61-190777  8/1961  Japan .

Primary Examiner—Michael J. Tokar
Attorney, Agent, or Firm—Foley & Lardner Schwartz, Jeffery, Schwaab, Mack, Blumenthal & Evans

[57]  ABSTRACT

A magnetic resonance imaging system erases magnetization components of at least a pair of adjacent regions sandwiching a region to be examined including a predetermined portion of interest of an object to be examined, and then selectively excites the region to be examined to obtain image information based on magnetic resonance data of the region to be examined. The magnetic resonance imaging system includes a controller for changing the polarity of a gradient field, which is applied simultaneously with a $\pi/2$ pulse, in units of the pair of adjacent regions when the magnetization components are to be erased.

6 Claims, 4 Drawing Sheets

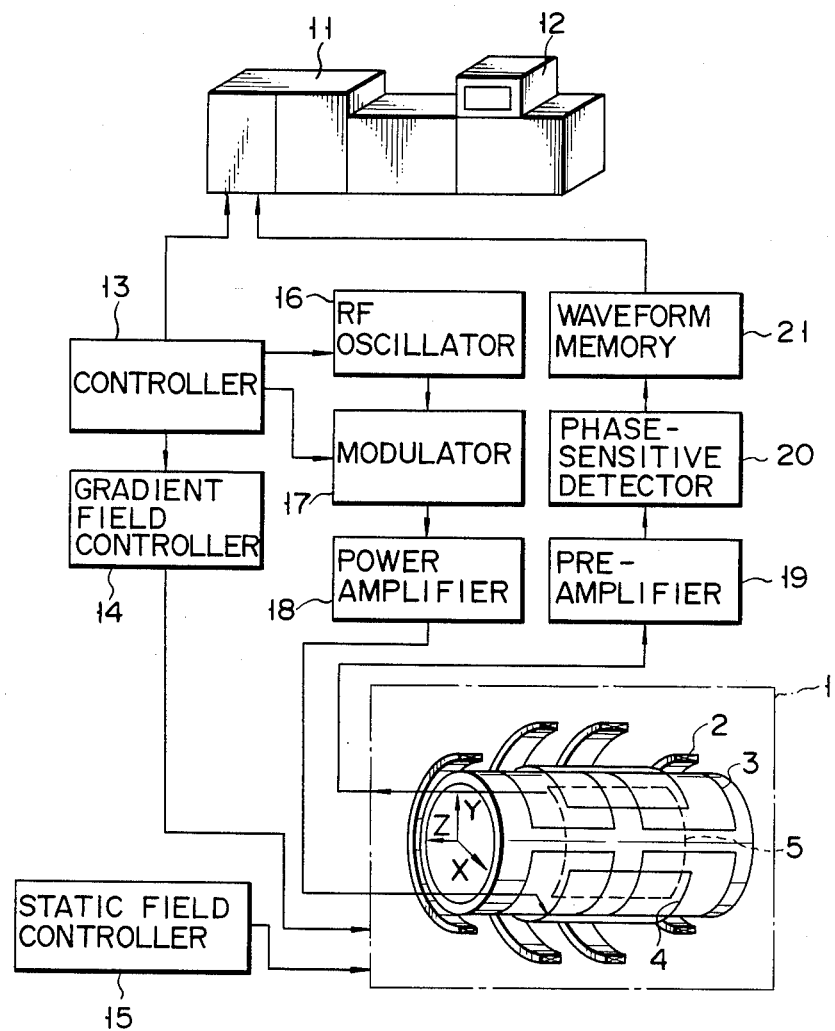
F I G. 2

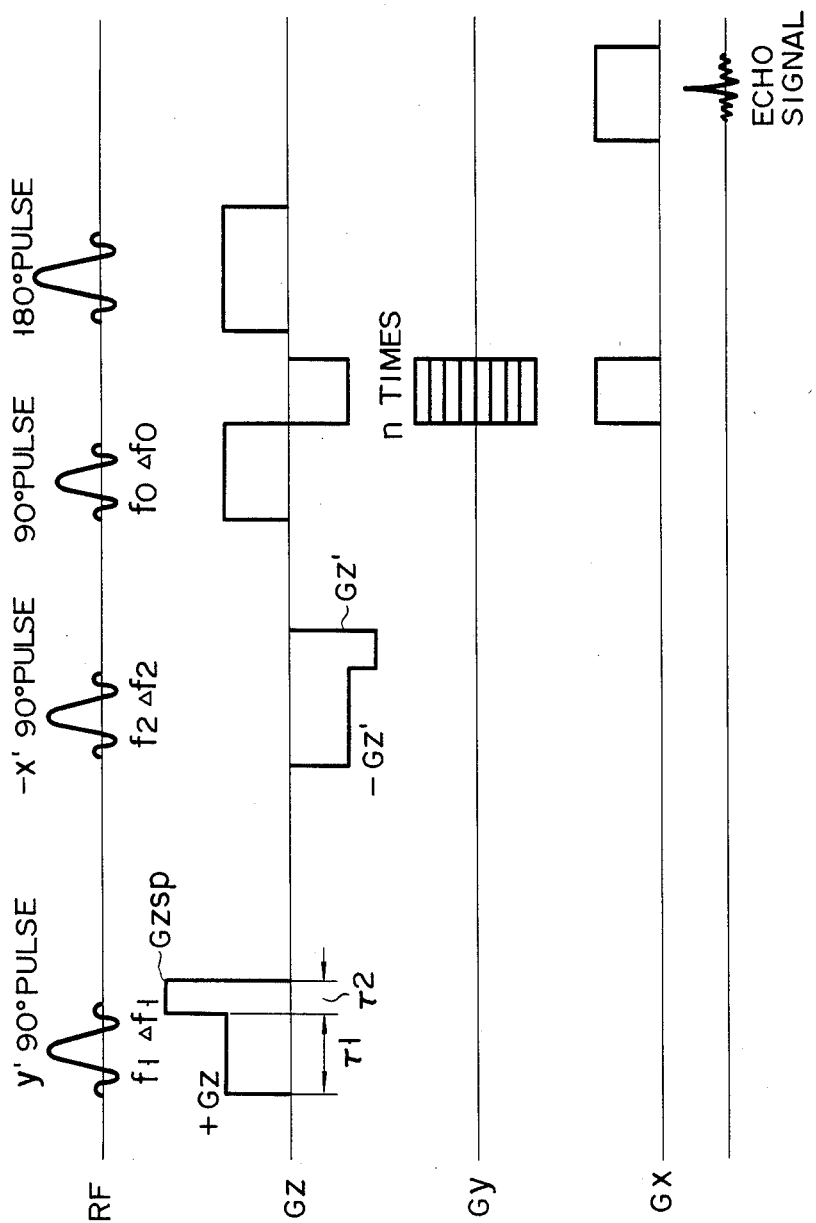

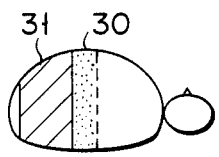
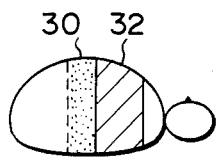
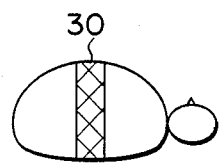
F I G. 4A   F I G. 4B   F I G. 4C
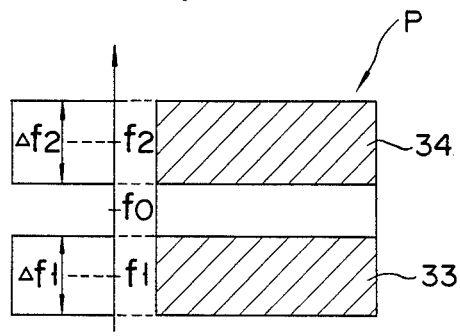
F I G. 5
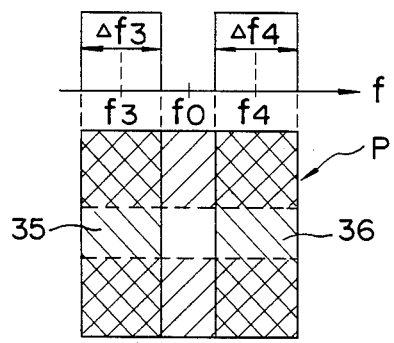
F I G. 6
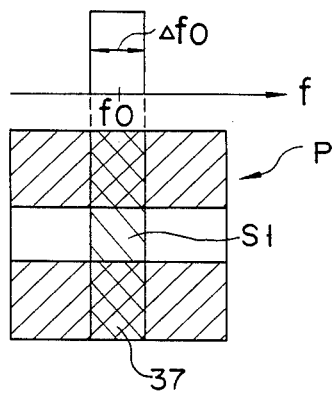
F I G. 7

MAGNETIC RESONANCE IMAGING SYSTEM

BACKGROUND OF THE INVENTION

The present invention relates to a magnetic resonance imaging (MRI) system for observing magnetic resonance (MR) information of an object to be examined by utilizing a magnetic resonance (MR) phenomenon.

In an MRI system, a uniform static magnetic field is applied to a predetermined portion of an object to be examined, and a gradient field in a direction perpendicular to a surface of a specific slice portion including a portion of interest and an excitation pulse as a high-frequency (normally a radio frequency (RF)) magnetic field in a direction orthogonal to the static magnetic field are applied to the object to be examined and superposed on the static magnetic field. As a result, magnetic resonance (MR) is excited in specific nuclear spins of only the slice portion. In this system, a magnetic resonance (MR) signal generated after the magnetic field of the excitation pulse is deenergized is detected by the resonated nuclear spins, and the MR signal is processed to form image information. Note that in this system, when MR is to be excited and MR signals are to be acquired, gradient fields in a plurality of directions are applied to the slice portion as needed so that the acquired MR signals include position information. For example, in a case of two-dimensional Fourier transform, a phase-encoding gradient field in a first direction is used during excitation of MR, and a reading gradient field in a second direction is used during acquisition of the MR signals. The first and second directions are normally parallel to the selected slice surface and orthogonal to each other.

A conventional MRI system has the following drawbacks.

(1) When an MR image of a slice portion selected by the MRI system is to be formed, if humor, especially blood is flowed into the slice portion from the outside thereof, an artifact is caused in a phase-encoding direction. Such an artifact interferes with a diagnosis performed by observing an MR image.

(2) In order to obtain an MR image of a given local portion in a selected slice portion, a surface coil is used to receive an MR signal from only the local portion, thereby performing local imaging. However, a system using the surface coil is effective to form MR images of local portions on and near the surface of the object to be examined but not suitable for imaging a deep portion.

(3) When a diagnosis is made by extracting an MR signal of a given local portion in a selected slice portion and obtaining resonant frequency information on the basis of magnetic resonance (MR) spectroscopy, a topical magnetic resonance (TMR) system or the system using the surface coil is used. In the TMR system, only a local portion is selectively excited. In this system, in order to change a static magnetic field distribution a range of a current to be flowed through the coil or a position of an object to be examined must be changed, thereby complicating the system. Similar to the system described in item (2), the TMR system is effective to receive MR signals from portions on and near the surface of the object to be examined but cannot be used to image a deep portion.

An MRI system is proposed to solve the problems described in items (1), (2), and (3), wherein transverse and longitudinal magnetization components of regions adjacent to a region to be examined including a portion of interest are erased in advance, and then MR information of the region to be examined is obtained (Japanese Patent Application No: 61-190777).

According to the above system, when transverse and longitudinal magnetization components of two adjacent regions sandwiching a region to be examined are to be erased, the adjacent regions sandwiching the region to be examined are selectively excited using a $\pi/2$ pulse. In this case, in order to selectively excite the two adjacent regions, excitation pulses having different frequencies f1 and f2 (frequency bands are $\Delta$f1 and $\Delta$f2, respectively) sandwiching a frequency band corresponding to the region to be examined need be applied.

In order to generate the excitation pulses having different frequencies f1 and f2, an oscillator having a wide oscillation frequency band to be selected or two oscillators having different oscillation frequencies need be arranged.

SUMMARY OF THE INVENTION

It is an object of the present invention to provide an MRI system, which does not require an oscillator having a complicated arrangement for erasing magnetization components of adjacent regions sandwiching a region to be examined.

In the MRI system according to the present invention, transverse and longitudinal magnetization components of at least a pair of adjacent regions sandwiching a region to be examined are erased, and then, the region to be examined is selectively excited to obtain MR information of the region to be examined. The system includes a controller for changing polarities of gradient fields, which are applied substantially at the same time when a $\pi/2$ pulse is applied, in units of adjacent regions, when the transverse and longitudinal magnetization components are to be erased.

FIG. 1 is a view for explaining a case wherein a pair of adjacent regions symmetrical about, e.g., a gradient field center are selectively excited.

First, gradient field G having a positive gradient and a $\pi/2$ pulse having carrier frequency f1 and frequency band $\Delta$f1 are applied to an object to be examined to selectively excite slice portion S1. Then, gradient field G' having a negative gradient is generated when slice portion S2 is to be selectively excited. Accordingly, slice portion S2 can be selectively excited using carrier frequency f1 used for exciting slice portion S1. That is, a single carrier frequency can be used for selectively exciting the two regions, i.e., slice portions S1 and S2.

In addition, this system can be applied not only to the case wherein the two regions symmetrical about the gradient field center are selectively excited, as described above, but also to a case wherein a plurality of asymmetrical slice portions are selectively excited. In the latter case, by changing polarities of gradient fields in units of slice portions, the frequency range of required carrier frequencies can be reduced to ½ or less that of the conventional system.

According to the MRI system of the present invention, when transverse and longitudinal magnetization components of a pair of adjacent regions sandwiching a region to be examined are to erased, the frequency band of carriers of a $\pi/2$ pulse can be reduced to ½ or less that of the conventional system because polarities of gradient fields, which are applied to an object to be examined substantially at the same time when the $\pi/2$ pulse is applied, are changed in units of regions.

BRIEF DESCRIPTION OF THE DRAWINGS

FIG. 2 is a block diagram of an arrangement of a magnetic resonance imaging system according to an embodiment of the present invention;

FIGS. 3A to 3E are timing charts of a pulse sequence in the system in FIG. 2;

FIGS. 4A to 4C are views for explaining an operation of the system in FIG. 2; and FIGS. 5 to 7 are views for explaining an operation of another embodiment of the present invention.

DETAILED DESCRIPTION OF THE PREFERRED EMBODIMENTS

Figure 1:
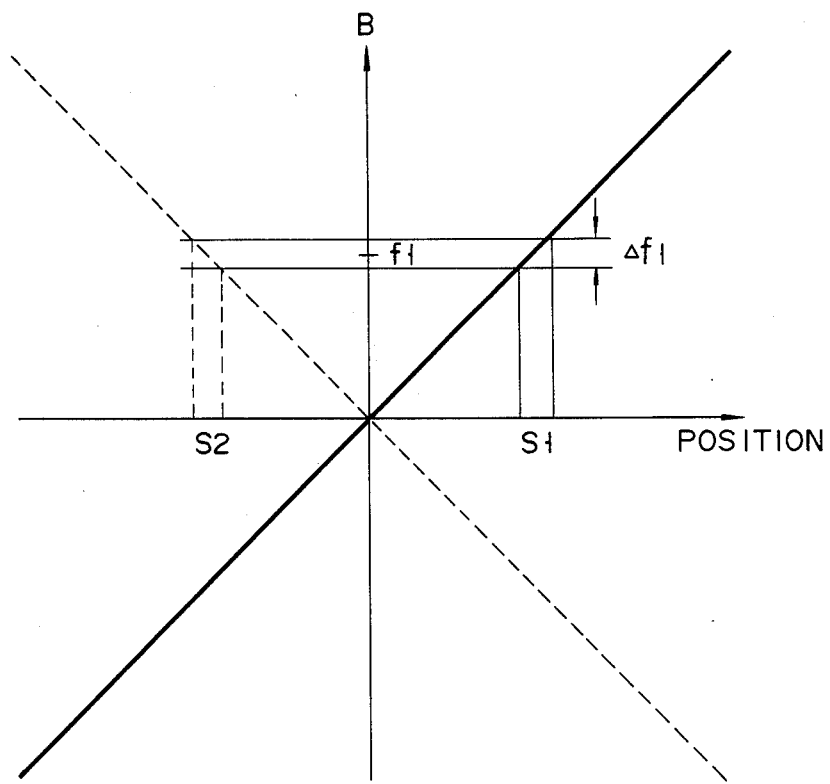
FIG. 1 is a view for explaining the principle of the present invention.

An MRI system according to an embodiment of the present invention will be described with reference to FIG. 2.

Magnetic assembly 1 comprises static magnetic field coil system 2, gradient field coil system 3, excitation coil system 4, and sensing coil system 5. Static magnetic field coil system 2 is used to apply a main magnetic field consisting of a static magnetic field of a predetermined intensity to an object inserted and located in magnetic assembly 1. Gradient field coil system 3 is used to apply gradient fields (normally linear gradient fields) in x, y, and z directions to the object to be examined. Excitation coil system 4 is used to apply high frequency pulses, i.e., RF pulses for exciting MR to nuclear spins at a predetermined portion of the object to be examined. For example, $\pi/2$ pulses (i.e., 90° pulses) and $\pi$ pules (i.e., 180° pulses) consisting of selective excitation pulses are used as RF pulses. Sensing coil system 5 is used to detect an MR signal generated in the object to be examined.

Data processor unit 11 comprising a computer is connected to display 12 and system controller 13. Controller 13 is connected to gradient field controller 14 and modulator 17. Gradient field controller 14 is connected to gradient field coil system 3 to cause system 3 to generate a gradient field and controls the gradient field. An output from RF oscillator 16 is modulated by modulator 17 controlled by controller 13 and is supplied to power amplifier 18. Power amplifier 18 is coupled to excitation coil system 4. Sensing coil system 5 is coupled to phase-sensitive detector 20 through pre-amplifier 19. Phase-sensitive detector 20 is connected to waveform memory 21 which is connected to data processing unit 11.

System controller 13 generates a timing signal for acquiring MR data as observation data of an MR signal and controls operations of gradient field controller 14 and modulator 17, thereby controlling generation sequences of gradient fields Gx, Gy, and Gz and high frequency pulse RF.

Gradient field controller 14 controls ON/OFF of a current to be flowed through gradient field coil system 3 and/or its magnitude, thereby controlling a gradient field to be applied to the object to be examined.

Static magnetic field controller 15 controls a current to be supplied to static magnetic field coil system 2, thereby applying predetermined static magnetic field H0 to the object to be examined.

RF oscillator 16 is controlled by controller 13 to generate a high-frequency signal. A frequency of the high-frequency signal is also controlled by controller 13. Modulator 17 modulates an amplitude of the high-frequency signal output from RF oscillator 16 in accordance with a predetermined modulation signal supplied from controller 13, thereby generating a high-frequency pulse having a predetermined timing and an envelope. Power amplifier 18 amplifies a power of the high-frequency pulse output from modulator 17 and supplies it to excitation coil system 4.

Pre-amplifier 19 amplifies an MR signal detected by detection coil system 5. Phase-sensitive detector 20 detects the amplified MR signal. Waveform memory 21 stores waveform data of the MR signal detected by phase-sensitive detector 20.

Data processing unit 11 receives timing information from controller 13 and controls an operation of controller 13. Data processing unit 11 reads out MR data from waveform memory 21 and processes it to reconstruct an MR image. In addition, data processing unit 11 causes display 12 to display instruction information concerning an operation to an operator as needed.

Frequencies of the high-frequency signal which can be generated by RF oscillator 16 are, e.g., center frequency f0 corresponding to a central position of a local portion and different frequencies f1 and f2 sandwiching frequency f0. RF oscillator 16 is controlled by controller 13 to select some of these frequencies, and an envelope and a frequency band of the high-frequency signal are controlled by modulator 17.

Referring to FIGS. 3A to 3E, an operation of the MRI system for obtaining an MR image of a predetermined portion of an object to be examined will be described below.

First, static magnetic field controller 15 supplies an excitation current to static magnetic field coil system 2 to generate uniform static magnetic field H0 in a z-axis direction in the drawings. Magnetization of an object to be examined (located in magnetic assembly 1) is oriented in the z-axis direction by magnetic field H0.

Then, a high-frequency pulse and a gradient field are applied by RF oscillator 16, modulator 17, and static magnetic field controller 14.

As shown in FIG. 4A, high-frequency pulse RF is applied to an object to be examined (refer to FIG. 3A) so as to excite first adjacent region 31 having a predetermined thickness (a size in a direction perpendicular to slice surface 30), located adjacent to slice surface 30, which is a region to be examined including a portion of interest from which an MR image is to be obtained. High-frequency pulse RF is a $\pi/2$ pulse (90° pulse) consisting of a selective excitation pulse having frequency band $\Delta f1$ and carrier frequency f1 in a y' direction in the rotating coordinate system. At this time, as shown in FIG. 3B, slicing gradient field Gz in a z-axis direction is simultaneously applied to the object to be examined. In this case, as for gradient field Gz, a slicing magnetic field having a normal intensity is applied, to the object to be examined for predetermined time $\tau 1$, i.e., the slice portion is excited, and then magnetic field Gzsp having a higher intensity is applied to the object to be examined for predetermined time $\tau 2$. Magnetic field Gzsp is called a spoiler. Transverse and longitudinal magnetization components of region 31 are diffused by spoiler Gzsp, thereby erasing the transverse magnetization component.

As shown in FIG. 48, a selective excitation pulse ($\pi/2$ pulse) having frequency band $\Delta f2$ and carrier frequency f2 in a $-x'$ direction in the rotating coordinate system is applied to the object to be examined so as to excite second adjacent region 32 having a predetermined thickness (a size in the direction perpendicular to slice surface 30), located to slice surface 30. At this time, slicing gradient field Gz' having a polarity different from that of slicing gradient field Gz is simultaneously applied to the object to be examined in a slicing direction. Similarly, in this case, as for slicing gradient field Gz', spoiler Gz'sp is applied to the object to be examined. As a result, transverse and longitudinal magnetization components of region 32 are diffused in the same manner as described above, thereby erasing the transverse magnetization component.

In this embodiment, as described above, the polarities of the first and second slicing gradient fields are set to be different from each other. By changing the polarities of the gradient fields in this manner, selective excitation can be performed on the basis of conditions f1=f2 and Δf1=Δf2, provided that first and second regions 31 and 32 are symmetrical about the gradient field center. Therefore, this system requires a high-frequency pulse having one type of carrier frequency. As a result, an oscillator having a simple arrangement can be used as a RF oscillator. In addition, the entire system can be easily controlled. Note that even if first and second regions 31 and 32 are not symmetrical about the gradient field center, since the difference between f1 and f2 can be reduced and the range of oscillation frequencies to be generated by RF oscillator 16 can be narrowed, the arrangements of RF oscillator 16 and the entire system can be simplified.

After the process described above, slice portion 30 is selectively excited in accordance with a normal pulse sequence, and MR signals from slice portion 30 are acquired (refer to FIG. 4C). In this embodiment, acquisition of MR signals from slice portion 30 is performed according to a pulse echo system. More specifically, a selective excitation pulse ($\pi/2$ pulse) (FIG. 3A) having carrier frequency f0 at frequency band Δf0 and slicing gradient field Gz (FIG. 3B) are applied to specify slice portion 30. Phase-encoding gradient field Gy (FIG. 3C), reading gradient field Gx (FIG. 3D), and a $\pi$ pulse (180° pulse) (FIG. 3A) are applied to obtain echo data corresponding to a one-line portion of slice portion 30. The above sequence is repeated while changing the intensity of phase encoding gradient field Gy. That is, necessary data is acquired by phase encoding, and an MR image is reconstructed on the basis of the data. The echo data is detected by sensing coil system 5. The data detected by sensing coil system 5 is supplied to phase-sensitive detector 20 through pre-amplifier 19 and then is subjected to spectrum analysis. An image is reconstructed by data processing unit 11 on the basis of this spectrum analysis result.

By reconstructing the image in this manner, MR signals caused by the blood flowing from regions 31 and 32 sandwiching slice portion 30 into slice portion 30 are attenuated. Thus, an artifact due to the blood flow can be reduced, thereby obtaining an MR image having excellent image quality.

The present invention is not limited to the above embodiment.

FIGS. 5 to 7 are views illustrating a case for obtaining data of only a region to be examined, which is located substantially at the center of a single slice portion.

First, as for one axis direction of the two axes perpendicular to the slice portion, transverse and longitudinal magnetization components of a pair of regions 33 and 34 (refer to FIG. 5) sandwiching a local portion are erased. Then, as for the other axis direction of the orthogonal axes, transverse and longitudinal magnetization components of a pair of regions 35 and 36 (refer to FIG. 6) sandwiching the local portion are erased. Finally, central region 37 is excited by a $\pi/2$ pulse including carrier frequency f0 (frequency band Δf0) to acquire data of only local portion S1 (refer to FIG. 7).

In this case, regions 33 and 34 in FIG. 5 are selectively excited using carrier frequencies f1 and f2 (frequency bands are Δf1 and Δf2, respectively) sandwiching carrier frequency f0. Similarly, regions 35 and 36 in FIG. 6 are selectively excited using carrier frequencies f3 and f4 (frequency bands are Δf3 and Δf4, respectively) sandwiching carrier frequency f0.

By changing the polarities of the gradient fields when regions 33 and 34 in FIG. 5 are to be excited, the difference between carrier frequencies f1 and f2 can be reduced (if regions 33 and 34 are symmetrical about the gradient field center, f1=f2). Therefore, an oscillator having a wide frequency band is not required. Similarly, in selective excitation of regions 35 and 36 in FIG 6, the difference between carrier frequencies f3 and f4 can be reduced.

What is claimed is:

1. A magnetic resonance imaging system comprising:
    static magnetic field generating means for generating a static magnetic field to be applied to an object to be examined;
    gradient field applying means for applying a predetermined gradient field to the object to be examined so as to be superposed on the static magnetic field;
    high-frequency pulse applying means for applying a high-frequency pulse having a predetermined frequency and a predetermined frequency band to the object to be examined, the high-frequency pulse including a $\pi/2$ pulse;
    detecting means for detecting a magnetic resonance signal from the object to be examined;
    control means for controlling each of said static magnetic field generating means, said gradient field applying means, said high-frequency pulse applying means, and said detecting means in accordance with a predetermined sequence to cause the object to be examined to generate magnetic resonance and to cause said detecting means to detect the magnetic resonance signal; and
    data processing means for processing data based on the magnetic resonance signal detected by said detecting means to obtain image information,
    wherein said control means includes local excitation control means for selectively exciting at least a pair of legions sandwiching a predetermined region to be examined including a portion of interest of the object to be examined by applying predetermined gradient fields having different polarities substantially simultaneously when a $\pi/2$ pulse is applied, erasing a transverse magnetization component of the adjacent regions, and then exciting the region to be examined.

2. A system according to claim 1, wherein said local excitation control means includes means for erasing magnetization components of a pair of regions adjacent to both surfaces of a selected slice portion which is the region to be examined, said pair of regions having a predetermined thickness.

3. A system according to claim 1, wherein said local excitation control means includes means for erasing magnetization components of a pair of regions sandwiching the region to be examined with respect to a first axis direction of two axes orthogonal to each other on a selected slice portion including the region to be examined and for erasing magnetization components sandwiching the region to be examined with respect to a second axis direction of the two axes.

4. A system according to claim 1, wherein said local excitation control means includes means for setting the pair of adjacent regions to be symmetrical about the center of a gradient field applied by said gradient field applying means.

5. A system according to claim 1, wherein said local excitation control means includes means for setting the pair of adjacent regions to be asymmetrical about the center of a gradient field applied by said gradient field applying means.

6. A system according to claim 1, wherein said local excitation control means includes means for erasing magnetization components by abruptly changing the intensities of the gradient fields applied when the adjacent regions are selectively excited.

* * * * *